United States Patent
Ding (10) Patent No.: US 9,148,088 B1
(45) Date of Patent: Sep. 29, 2015

(54) RF STACKED POWER AMPLIFIER BIAS METHOD

(71) Applicant: ADVANCED SEMICONDUCTOR ENGINEERING INC., Kaohsiung (TW)

(72) Inventor: Jaw-Ming Ding, Taoyuan County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 14/283,129

(22) Filed: May 20, 2014

(51) Int. Cl.
| | | |
|---|---|---|
| H03F 3/04 | (2006.01) | |
| H03G 3/00 | (2006.01) | |
| H03F 1/02 | (2006.01) | |
| H03F 3/19 | (2006.01) | |
| H03F 3/21 | (2006.01) | |
| H03F 1/34 | (2006.01) | |
| H03F 1/30 | (2006.01) | |

(52) U.S. Cl.
CPC ............... *H03F 1/0205* (2013.01); *H03F 1/30* (2013.01); *H03F 1/34* (2013.01); *H03F 3/19* (2013.01); *H03F 3/21* (2013.01); *H03F 2200/129* (2013.01); *H03F 2200/447* (2013.01); *H03F 2200/451* (2013.01)

(58) Field of Classification Search
USPC .................. 330/311, 293, 296, 127
IPC ..................... H03F 3/04; H03G 3/00
See application file for complete search history.

(56) References Cited

U.S. PATENT DOCUMENTS

| | | | |
|---|---|---|---|
| 5,032,799 A | 7/1991 | Milberger et al. | |
| 5,469,116 A * | 11/1995 | Slemmer | 331/74 |
| 8,779,859 B2 * | 7/2014 | Su et al. | 330/311 |
| 2002/0113655 A1 * | 8/2002 | Lautzenhiser et al. | 330/295 |
| 2007/0075693 A1 * | 4/2007 | Xi | 323/282 |
| 2007/0273404 A1 * | 11/2007 | Ker et al. | 326/81 |
| 2011/0181360 A1 * | 7/2011 | Li et al. | 330/277 |
| 2012/0242410 A1 * | 9/2012 | Darwish et al. | 330/288 |
| 2014/0184337 A1 * | 7/2014 | Nobbe et al. | 330/296 |

FOREIGN PATENT DOCUMENTS

CN 101873104 A 10/2010

* cited by examiner

*Primary Examiner* — Patricia T Nguyen
(74) *Attorney, Agent, or Firm* — Foley & Lardner LLP; Cliff Z. Liu; Angela D. Murch (57) ABSTRACT

The RF stacked power amplifier comprises a voltage-dividing circuit, a negative feedback bias circuit, a current source circuit and a stacked amplifying circuit. The voltage-dividing circuit receives a system voltage and divides the system voltage for outputting a first reference partial voltage and a second reference partial voltage. The negative feedback bias circuit receives a negative feedback reference voltage and correspondingly outputs a second bias reference voltage according to a result of comparing the second reference partial voltage and the negative feedback reference voltage. The current source circuit determines a bias reference current according to the first reference partial voltage. The stacked amplifying circuit outputs the negative feedback reference voltage and determines an operation bias point according to a first bias reference voltage and the bias reference current. The RF stacked power amplifier makes the voltage-drop and the power consumption of each transistor equal via the voltage-dividing circuit.

12 Claims, 5 Drawing Sheets

RF STACKED POWER AMPLIFIER BIAS METHOD

BACKGROUND OF THE INVENTION

1. Field of the Invention

The instant disclosure relates to a RF stacked power amplifier; in particular, to the bias current and the bias voltage of a RF stacked power amplifier.

2. Description of Related Art

Among hand-held wireless communication products, main direct current (DC) power consumption comes from a RF stacked power amplifier. Therefore, to keep a high linearity of the RF stacked power amplifier instead of distorting an amplified signal, and to maintain a high efficiency to support a long time of communication has always been a focus in designing the RF stacked power amplifier. In particular, there is an obvious characteristic of a time-varying wave packet when a broadly used digital modulation technique of orthogonal frequency-division multiplexing (OFDM) is adopted in a wireless communication system, and a constant of peak to average power ratio (PAPR) of which is way higher than that of the current wireless communication system; in other words, the variation of the wave packet with time is more dramatic, and thus a demand of the linearity of the RF stacked power amplifier is higher.

With the development of the CMOS process, the processing length of the transistor could be smaller and smaller, for example, from 0.35 um to 65 nm or even to 25 nm. The processing length of the transistor could be smaller, but the breakdown voltage of the transistor is relatively decreased. The breakdown voltage of the transistor decreases, so the transistor is more likely to breakdown and thus to generate a large amount of current, which damages the transistor due to overheating.

SUMMARY OF THE INVENTION

The instant disclosure further provides a RF stacked power amplifier. The RF stacked power amplifier comprises a voltage-dividing circuit, a negative feedback bias circuit, a current source circuit and a stacked amplifying circuit. The voltage-dividing circuit receives a system voltage and divides the system voltage so as to output a first reference partial voltage and a second reference partial voltage. The negative feedback bias circuit is electrically connected to the voltage-dividing circuit so as to receive the second reference partial voltage, and the negative feedback bias circuit receives a negative feedback reference voltage and correspondingly outputs a second bias reference voltage according to a result of comparing the second reference partial voltage and the negative feedback reference voltage. The current source circuit is electrically connected to the voltage-dividing circuit so as to receive the first reference partial voltage, the current source circuit determines a bias reference current according to the first reference partial voltage. The stacked amplifying circuit is electrically connected to the current source circuit and the negative feedback bias circuit, and the stacked amplifying circuit outputs the negative feedback reference voltage and determines an operation bias point according to a first bias reference voltage and the bias reference current. In alternative current (AC) mode, the stacked amplifying circuit receives and amplifies a RF input signal and correspondingly outputs a RF output signal.

In an embodiment of the instant disclosure, the voltage-dividing circuit comprises a first reference resistor and a second reference resistor. One terminal of the first reference resistor is electrically connected to a ground voltage and another terminal of the first reference resistor outputs a first reference voltage, wherein the first reference resistor has a first resistance value. One terminal of the second reference resistor is electrically connected to another terminal of the first reference resistor and another terminal of the second reference resistor is electrically connected to the system voltage, wherein the second reference resistor has a second resistance value. Voltage value of the first reference voltage is determined according to the system voltage, the first resistance value and the second resistance value, and the first reference partial voltage and the second reference partial voltage are the first reference voltage.

In an embodiment of the instant disclosure, the negative feedback bias circuit comprises a second comparator, a second filtering resistor and a second filtering capacitor. An positive input terminal of the second comparator is electrically connected to one terminal of the second resistor so as to receive the first reference voltage and a negative input terminal of the second comparator is electrically connected to the stacked amplifying circuit so as to receive the negative feedback reference voltage, and the second comparator compares the first reference voltage with the negative feedback reference voltage and correspondingly outputs the second bias reference voltage at its output terminal. One terminal of the second filtering resistor is electrically connected to an output terminal of the second comparator and another terminal of the second filtering resistor is electrically connected to the stacked amplifying circuit. One terminal of the second filtering capacitor is electrically connected to another terminal of the second filtering resistor and another terminal of the second filtering capacitor is electrically connected to the ground voltage.

In an embodiment of the instant disclosure, the current source circuit comprises a steady-current transistor, a voltage comparator and a reference current source. Source of a steady-current transistor is electrically connected to the ground voltage. A positive input terminal of a voltage comparator is electrically connected to the steady-current transistor so as to receive drain voltage of the steady-current transistor, a negative input terminal of a voltage comparator is electrically connected to another terminal of the first reference resistor so as to receive the first reference voltage, and an output terminal of a voltage comparator is electrically connected to gate of the steady-current transistor, wherein the voltage comparator is configured to compare drain voltage of the steady-current transistor and the first reference voltage. One terminal of the reference current source is electrically connected to the system voltage and another terminal of the reference current source is electrically connected to drain of the steady-current transistor, wherein the reference current source has a predetermined reference current. The voltage comparator adjusts gate voltage of the steady-current transistor according to a result of comparing the drain voltage of the steady-current transistor and the first reference voltage so as to stabilize the predetermined reference current.

In an embodiment of the instant disclosure, the stacked amplifying circuit comprises a first inductor, a first transistor, a second transistor and a second inductor. One terminal of a first inductor is electrically connected to output terminal of the voltage comparator. Gate of the first transistor is electrically connected to another terminal of the first inductor so as to receive the first bias reference voltage and source of the first transistor is electrically connected to the ground voltage, wherein the first transistor and the steady-current transistor form a configuration of a current mirror circuit and width-to-length ratio of the first transistor to the steady-current transistor determines ratio of the bias reference current to the predetermined reference current. Gate of the second transistor is electrically connected to another terminal of the second filtering resistor so as to receive the second bias reference voltage and source of the second transistor is electrically connected to drain of the first transistor and outputs the negative feedback reference voltage, wherein the second transistor and the second comparator form a configuration of a source follower. One terminal of the second inductor is electrically connected to drain of the second transistor and another terminal of the second inductor is electrically connected to the system voltage. Ratio of the second resistance value to the first resistance value determines ratio of drain-to-source voltage of the first transistor to drain-to-source voltage of the second transistor. Drain-to-source voltage of the first transistor equals to drain-to-source voltage of the steady-current transistor so as to reduce early effect.

In an embodiment of the instant disclosure, the stacked amplifying circuit further comprises an input capacitor and an output capacitor. One terminal of the input capacitor receives the RF input signal and another terminal of the input capacitor is electrically connected to gate of the first transistor. One terminal of the output capacitor is electrically connected to drain of the second transistor and another terminal of the output capacitor outputs the RF output signal.

The instant disclosure further provides a bias method used in a RF stacked power amplifier. The RF stacked power amplifier comprises a voltage-dividing circuit, a negative feedback bias circuit, a current source circuit and a stacked amplifying circuit. The negative feedback bias circuit is electrically connected to the voltage-dividing circuit, the current source circuit is electrically connected to the voltage-dividing circuit, and the stacked amplifying circuit is electrically connected to the current source circuit and the negative feedback bias circuit. The bias method comprises steps as follows: receiving a system voltage via the voltage-dividing circuit, dividing the system voltage and outputting a first reference partial voltage and a second reference partial voltage; receiving a negative feedback reference voltage and correspondingly outputting a second bias reference voltage according to a result of comparing the second reference partial voltage and the negative feedback reference voltage via the negative feedback bias circuit; determining a bias reference current according to the first reference partial voltage via the current source circuit; and outputting the negative feedback reference voltage via the stacked amplifying circuit and determining an operation bias point according to a first bias reference voltage and the bias reference current wherein in AC mode the stacked amplifying circuit receives and amplifies a RF input signal and correspondingly outputs a RF output signal.

To sum up, the RF stacked power amplifier and the bias method provided by the instant disclosure make the voltage-drop and the power consumption of each transistor equal via the voltage-dividing circuit, provides a bias current which could be controlled via the current source circuit, and also provides a stable current with the temperature compensation and the compensation of the system voltage.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

The following description is going to illustrate the RF stacked power amplifier and the bias method provided by the instant disclosure with figures; however, it is not restricted by the embodiments below.

[One Embodiment of a RF Stacked Power Amplifier]

Figure 1:
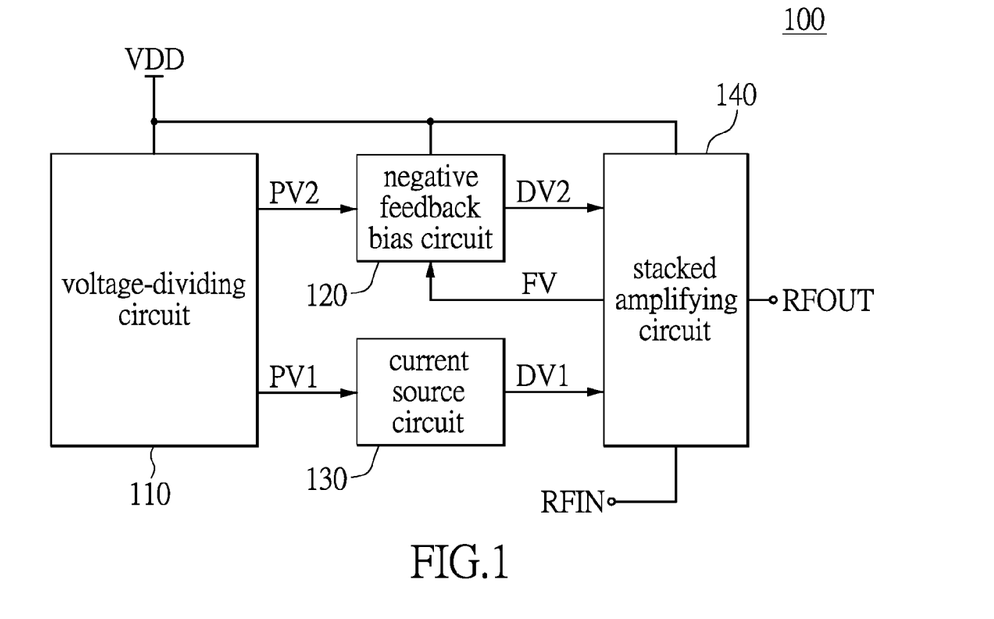
FIG. 1 is a block diagram of a RF stacked power amplifier according to an embodiment of the instant disclosure.

Please refer to FIG. 1, FIG. 1 is a block diagram of a RF stacked power amplifier according to an embodiment of the instant disclosure. As shown in FIG. 1, the RF stacked power amplifier 100 comprises a voltage-dividing circuit 110, a negative feedback bias circuit 120, a current source circuit 130 and a stacked amplifying circuit 140. In AC mode, the stacked amplifying circuit 140 receives and amplifies the RF input signal RFIN and correspondingly outputs the RF output signal RFOUT. In the present embodiment, the voltage-dividing circuit 110 receives the system voltage VDD and divides the system voltage VDD so as to output the first reference partial voltage PV1 and the second reference partial voltage PV2 wherein the voltage-dividing circuit 110 is a resistive circuit. The negative feedback bias circuit 120 is electrically connected to the voltage-dividing circuit 110 so as to receive the second reference partial voltage PV2. The negative feedback bias circuit 120 receives the negative feedback reference voltage FV and correspondingly outputs the second bias reference voltage DV2 according to the second reference partial voltage PV2 and the negative feedback reference voltage FV. The current source circuit 130 is electrically connected to the voltage-dividing circuit 110 so as to receive the first reference partial voltage PV1. The current source circuit determines the bias reference current according to the first reference partial voltage PV1.

In a wireless communication system, the RF stacked power amplifier 100 is configured to reinforce the output power of the transmitter. Thus, the RF stacked power amplifier 100 has to provide a highly efficient operation and a high linearity with limited power consumption to satisfy the required high linearity of the RF stacked power amplifier 100 in the system. In the instant disclosure, via the voltage-dividing circuit 110, voltage and power consumption could be averaged so as to prevent from the breakdown of the components in the stacked amplifying circuit 140. Moreover, even though the elements in the stacked amplifying circuit 140 are not matching, the breakdown could be prevented also via averaging the voltage and power consumption. Furthermore, the RF stacked power amplifier 100 provided by the instant disclosure biases the stacked amplifying circuit 140 via the negative feedback bias circuit 120, wherein the negative feedback bias circuit 120 compares the received second reference partial voltage PV2 and the negative feedback reference voltage FV and correspondingly outputs the stable second bias reference voltage DV2 to the stacked amplifying circuit 140 (that is, the negative feedback adjustment mechanism). Additionally, the current source circuit 130 of the RF stacked power amplifier 100 also provides the bias reference current such that the RF stacked power amplifier 100 could be not influenced by the changes of temperature and system voltage. In other words, in the RF stacked power amplifier provided by the instant disclosure, the temperature compensation could be made and the Power Supply Rejection Ratio (PSRR) would be raised.

For a specific instruction on an operation process of the RF stacked power amplifier 100 of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another Embodiment of the RF Stacked Power Amplifier]

Figure 2:
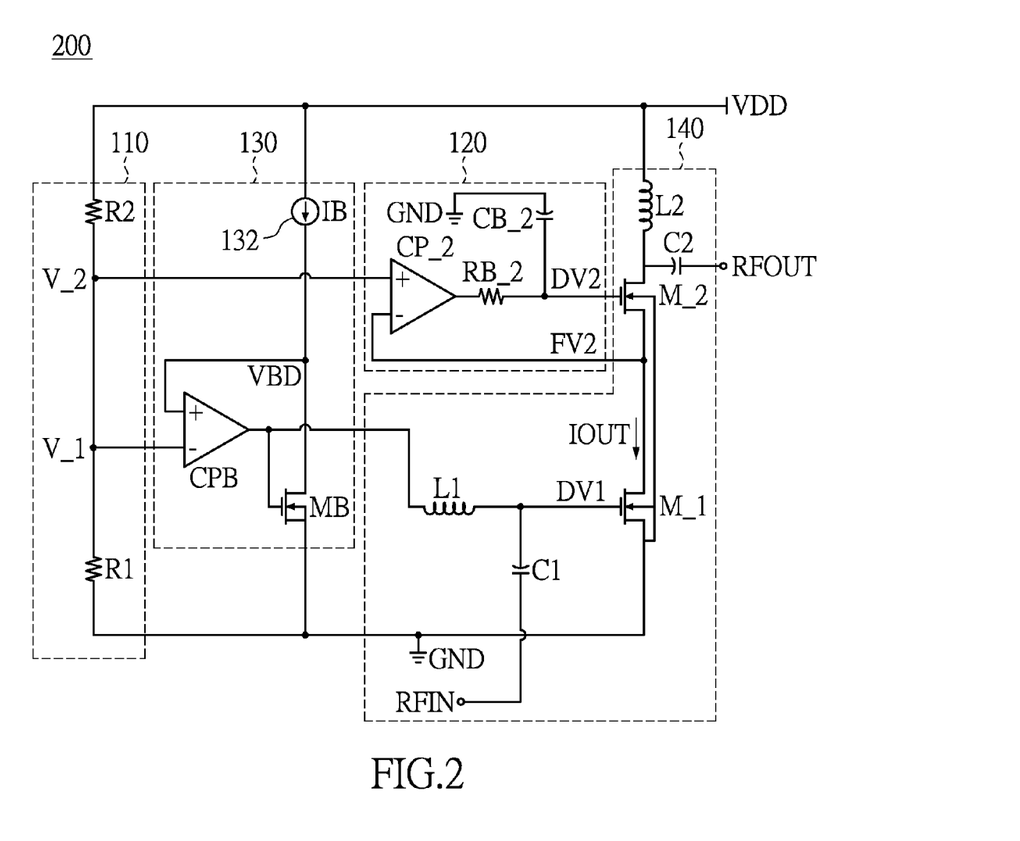
FIG. 2 is a detailed circuit diagram of a RF stacked power amplifier according to another embodiment of the instant disclosure.

Please refer to FIG. 2, FIG. 2 is a detailed circuit diagram of a RF stacked power amplifier according to another embodiment of the instant disclosure. Different from the embodiment shown in FIG. 1, in the RF stacked power amplifier 200 of the present embodiment, the voltage-dividing circuit 110 comprises a first reference resistor R1 and a second reference resistor R2. The negative feedback bias circuit 120 comprises a second comparator CP_2, a second filtering resistor RB_2 and a second filtering capacitor CB_2. The current source circuit 130 comprises a steady-current transistor MB, a voltage comparator CPB and a reference current source 132. The stacked amplifying circuit 140 comprises a first inductor L1, a second inductor L2, a first transistor M_1, a second transistor M_2, an input capacitor C1 and an output capacitor C2. In the present embodiment, the one terminal of the first reference resistor R1 is electrically connected to the ground voltage GND, and another terminal of the first reference resistor R1 outputs the first reference voltage V_1 (be viewed as the first reference partial voltage PV1) and second reference voltage V_2 (be viewed as the second reference partial voltage PV2). The first reference resistor R1 has a first resistance value. One terminal of the second reference resistor R2 is electrically connected to another terminal of the first reference resistor R1, and another terminal of the second reference resistor R2 is electrically connected to the system voltage VDD. The second reference resistor R2 has a second resistance value. The positive input terminal of the second comparator CP_2 is electrically connected to one terminal of the second reference resistor R2 so as to receive the second reference voltage V_2. The negative input terminal of the second comparator CP_2 is electrically connected to the stacked amplifying circuit 140 so as to receive the negative feedback reference voltage FV2. The second comparator CP_2 compares the second reference voltage V_2 with the negative feedback reference voltage FV2, and correspondingly outputs the second bias reference voltage DV2 at its output terminal. One terminal of the second filtering resistor RB_2 is electrically connected to the output terminal of the second comparator CP_2, and another terminal of the second filtering resistor RB_2 is electrically connected to the stacked amplifying circuit 140. One terminal of the second filtering capacitor CB_2 is electrically connected to another terminal of the second filtering resistor RB_2, and another terminal of the second filtering capacitor CB_2 is electrically connected to the ground voltage GND. Source of the steady-current transistor MB is electrically connected to the ground voltage GND. The positive input terminal of the voltage comparator CPB is electrically connected to the drain of the steady-current transistor MB so as to receive drain voltage of the steady-current transistor MB, and the negative input terminal of the voltage comparator CPB is electrically connected to another terminal of the first reference resistor R1 so as to receive the first reference voltage V_1. The output terminal of the voltage comparator CPB is electrically connected to gate of the steady-current transistor MB. The voltage comparator CPB is configured to compare the drain voltage of the steady-current transistor MB with the first reference voltage V_1. One terminal of the reference current source 132 is electrically connected to the system voltage VDD, and another terminal of the reference current source 132 is electrically connected to drain of the steady-current transistor MB. The reference current source 132 has a predetermined reference current IB. One terminal of the first inductor L1 is electrically connected to the output terminal of the voltage comparator CPB. Gate of the first transistor M_1 is electrically connected to another terminal of the first inductor L1 so as to receive the first bias reference voltage DV1. Source of the first transistor M_1 is electrically connected to the ground voltage GND, wherein the first transistor M_1 and the steady-current transistor MB form a configuration of a current mirror circuit. Gate of the second transistor M_2 is electrically connected to another terminal of the second filtering resistor RB_2 so as to receive the second bias reference voltage DV2. Source of the second transistor M_2 is electrically connected to drain of the first transistor M_1 and outputs the negative feedback reference voltage FV2, wherein the second transistor M_2 and the second comparator CP_2 form a configuration of a source follower. One terminal of the second inductor L2 is electrically connected to drain of the second transistor M_2, and another terminal of the second inductor L2 is electrically connected to the system voltage VDD. One terminal of the input capacitor C1 receives the RF input signal RFIN, and another terminal of the input capacitor C1 is electrically connected to gate of the first transistor M_1. One terminal of the output capacitor C2 is electrically connected to drain of the second transistor M_2, and another terminal of the output capacitor C2 outputs the RF output signal RFOUT.

In the following description is further instruction in teaching a work mechanism of the RF stacked power amplifier 200.

When the RF stacked power amplifier 200 have not started receiving the RF input signal RFIN yet, the first inductor L1 shows a low-impedance status, such as a short circuit, to a DC signal; on the other hand, the capacitors C1 and C2 show a high-impedance status, such as an open circuit, to the DC signal. When the RF stacked power amplifier 200 starts receiving the RF input signal RFIN, the first inductor L1 shows the high-impedance status, such as the open circuit, to a high-frequency signal; on the other hand, the capacitors C1 and C2 show the low-impedance status, such as the short circuit, to the high-frequency signal. Based on the above, the RF stacked power amplifier 200 is able to work well under both DC or AC working modes.

It is worth mentioning that, the reference partial voltages PV1 and PV2 in the embodiment shown in FIG. 1 are the same voltage in the present embodiment. In other words, in the present embodiment, the voltage value of the first reference voltage V_1 is determined according to the system voltage VDD, the first resistance value and the second resistance value, and also the first reference partial voltage PV1 and the second reference partial voltage PV2 (as shown in FIG. 1) are the first reference voltage V_1. In details, the RF stacked power amplifier 200 regulates the source voltage of the second transistor M_2 at the same voltage value as the first reference voltage via the virtual short effect of the second comparator CP_2. Briefly speaking, the drain-to-source voltage of the second transistor M_2 equals to the voltage-drop of the second reference resistor R2. Additionally, source of the second transistor M_2 is electrically connected to drain of the first transistor M_1, so the drain voltage of the first transistor M_1 equals to the first reference voltage V_1. Therefore, the drain-to-source voltage of the first transistor M_1 equals to the voltage-drop of the first reference resistor R1. It should be noticed that, the first transistor M_1 and the second transistor M_2 determine the operation bias point according to the first bias reference voltage DV1 and the bias reference current IOUT, and ratio of the second resistance value to the first resistance value determines ratio of the drain-to-source voltage of the first transistor M_1 to the drain-to-source voltage of the second transistor M_2. Moreover, in the present embodiment, the drain-to-source voltage of the first transistor M_1 equals to the drain-to-source voltage of the steady-current transistor MB so as to reduce the IOUT current variation vs temperature and system voltage.

To be brief, the RF stacked power amplifier 200 in the present embodiment controls the drain-to-source voltage of the first transistor M_1 and the drain-to-source voltage of the second transistor M_2 via the voltage-dividing circuit 110 (that is, the first reference resistor R1 and the second reference resistor R2) so as to average the voltage-drop and power consumption of the first transistor M_1 and the second transistor M_2 and further to prevent from the voltage breakdown of the first transistor M_1 and the second transistor M_2.

On the other hand, regarding to the PSRR, the RF stacked power amplifier 200 makes the drain voltage VBD of the steady-current transistor equal to the first reference voltage V_1 via the virtual short effect of the voltage comparator CPB, and further makes the drain-to-source voltage of the steady-current transistor equal to the voltage-drop of the first reference resistor R1, so as to stabilize the predetermined reference current IB outputted by the reference current source 132, wherein ratio of the width- to-length ration of the first transistor M_1 to the steady-current transistor MB determines ratio of the bias reference current IOUT to the predetermined reference current IB. It should be noticed that, the voltage comparator CPB adjusts the gate voltage of the steady-current transistor MB according to a result of comparing the first reference voltage and the drain voltage VBD. Accordingly, the RF stacked power amplifier prevents the influence resulted from the changes of the temperature and the system voltage via the adjustment of the current source circuit.

For a specific instruction on an operation process of the RF stacked power amplifier 200 of the instant disclosure, there is at least one of the embodiments for further instruction.

In the following embodiments, there are only parts different from embodiments in FIG. 2 described, and the omitted parts are indicated to be identical to the embodiments in FIG. 2. In addition, for an easy instruction, similar reference numbers or symbols refer to elements alike.

[Still Another Embodiment of the RF Stacked Power Amplifier]

Figure 3:
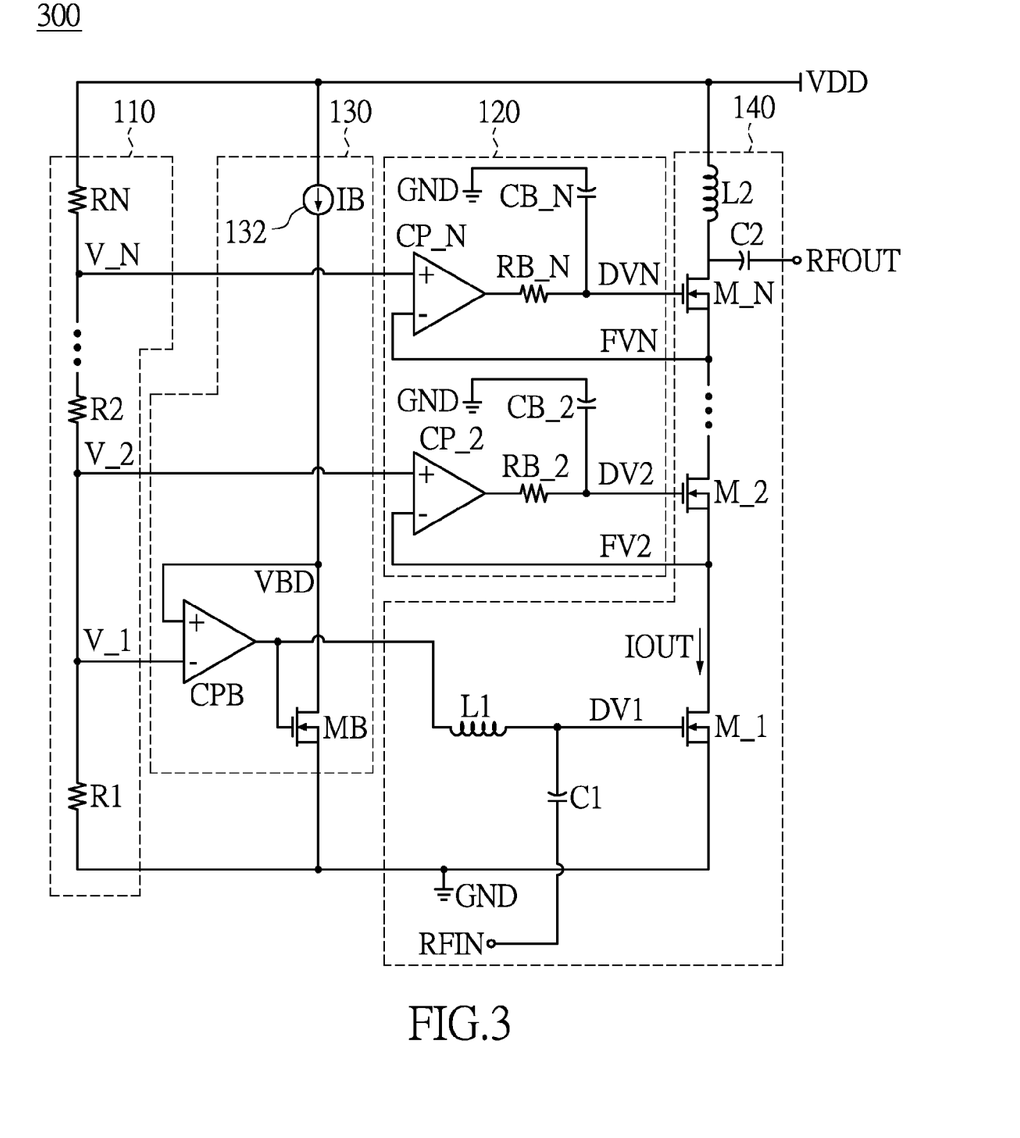
FIG. 3 is a detailed circuit diagram of a RF stacked power amplifier according to still another embodiment of the instant disclosure.

Please refer to FIG. 3, FIG. 3 is a detailed circuit diagram of a RF stacked power amplifier according to still another embodiment of the instant disclosure. Different from the embodiment shown in FIG. 1, in the RF stacked power amplifier 300 shown in the embodiment in FIG. 3, the voltage-dividing circuit 110 comprises N reference resistors R1~RN, wherein N is an integer greater than 1. The negative feedback bias circuit 120 comprises (N−1) comparators CP_2~CP_N, (N−1) filtering resistors RB_2~RB_N and (N−1) RF filtering capacitors CB_2~CB_N. The stacked amplifying circuit 140 comprises a first inductor L1, N transistors M_1~M_N, a second inductor L2, an input capacitor C1 and an output capacitor C2. Comparing with the embodiment shown in FIG. 3, the embodiment shown in FIG. 2 is merely for illustrating the RF stacked power amplifier, wherein N equals to 2.

In the present embodiment, N reference resistors R1~RN are connected with one another in series so as to form a configuration of a voltage-dividing circuit 110. The connecting relationship between the comparators CP_3~CP_N, the RF filtering resistors RB_3~RB_N and the filtering capacitors CB_3~CB_N is similar to the connecting relationship between the comparator CP_2, the RF filtering resistor RB_2 and the filtering capacitor CB_2, so there is no need to go into details here. The transistors M_1~M_N are connected with one another in series, as shown in FIG. 3.

It is worth mentioning that, the reference voltage V_1 shown in the embodiment shown in FIG. 3 is the first reference partial voltage PV1 shown in the embodiment shown in FIG. 1, and the reference voltage V_2~V_N is the second reference partial voltage PV2 shown in the embodiment shown in FIG. 1. Additionally, the reference voltage V_1~V_N could be determined according to each reference resistor R1~RN and the system voltage VDD. In details, in the present embodiment, the RF stacked power amplifier 300 stabilize the source voltage of the transistor M_N at the voltage value equal to the reference voltage V_N via the virtual short effect of the comparator CP_N. To be brief, the drain-to-source voltage of the transistor M_N equals to the voltage-drop of the reference resistor RN. Additionally, source of the transistor M_N is electrically connected to drain of the transistor M_N−1, so the drain voltage of the transistor M_N−1 equals to the reference voltage V_N. Therefore, the drain-to-source voltage of the transistor M_N equals to the voltage-drop of the reference resistor RN. Likewise, the RF stacked power amplifier 300 stabilizes the source voltage of the transistor M_2 at the voltage value equal to the reference voltage V_2 via the virtual short effect of the comparator CP_2. In short, the drain-to-source voltage of the transistor M_2 equals to the voltage-drop of the reference resistor R2. Additionally, source of the transistor M_2 is electrically connected to drain of the transistor M_1, so the drain voltage of the transistor M_1 also equals to the reference voltage V_2. Therefore, the drain-to-source voltage of the transistor M_1 equals to the voltage-drop of the first reference resistor R1. Briefly speaking, the RF stacked power amplifier 300 in the present embodiment controls the drain-to-source voltage of the transistors M_1~M_N via the voltage-dividing circuit (that is, the reference resistors R1~RN) so as to average the voltage-drop and the power consumption of the transistors M_1~M_N and further to prevent from the voltage breakdown of the transistors M_1~M_N.

On the other hand, regarding to the temperature compensation and the PSRR, similar to the embodiment shown in FIG. 2, the RF stacked power amplifier 300 makes the drain voltage VBD of the steady-current transistor MB equal to the reference voltage V_1 via the virtual short effect of the voltage comparator CPB and further makes the drain-to-source voltage of the steady-current transistor MB equal to the voltage-drop equal to the reference resistor R1 so as to stabilize the predetermined reference current IB outputted by the reference current source 132, wherein ratio of the width-to-length ratio of the first transistor M_1 to the steady-current transistor MB determines ratio of the bias reference current IOUT to the predetermined reference current IB. The following description is for further illustrating the simulating diagram of the temperature compensation and the compensation of the system voltage.

Figure 4:
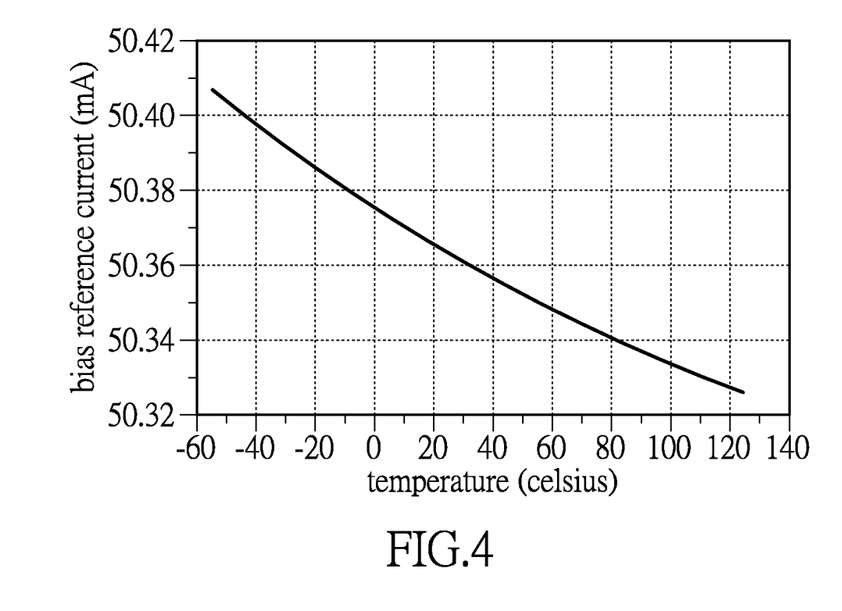
FIG. 4 is a curve diagram of the temperature compensation of the RF stacked power amplifier according to another embodiment of the instant disclosure.
Figure 5:
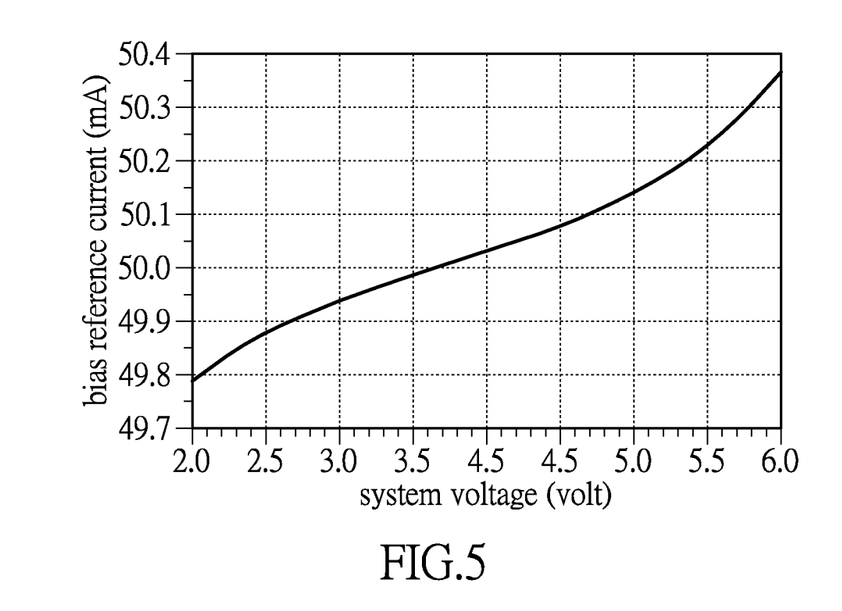
FIG. 5 is a curve diagram of the compensation of the system voltage of the RF stacked power amplifier according to another embodiment of the instant disclosure.

In conjunction with FIG. 4 and FIG. 5, FIG. 4 is a curve diagram of the temperature compensation of the RF stacked power amplifier according to another embodiment of the instant disclosure, and FIG. 5 is a curve diagram of the compensation of the system voltage of the RF stacked power amplifier according to another embodiment of the instant disclosure. As shown in FIG. 4, a horizontal axis represents the temperature, whose unit is Celsius (° C.), and a vertical axis represents the bias reference current, whose unit is milliampere (mA). When the environment temperature changes within −55° C.~125° C., the change of the bias reference current would be slight. In other words, in comparison to prior arts, the RF stacked power amplifier of the instant disclosure has less chances of facing a problem of facing a sudden dropping linearity with a varying surrounding temperature. Additionally, as shown in FIG. 5, a horizontal axis represents the system voltage, whose unit is volt (V), and a vertical axis represents the bias reference current, whose unit is milliampere (mA). When the system voltage changes within 2V~6V, the change of the bias reference current is within 49.7 mA~50.4 mA.

From the above, the instant disclosure provides a stacked skill which can prevent the voltage breakdown and also can average the voltage-drop of the power consumption of each transistor in series considering the case that the transistors are not matching. Also, the instant disclosure provides the bias current which could be controlled and provides stable currents with the temperature compensation and the compensation of the system voltage.

[One Embodiment of a Bias Method]

Figure 6:
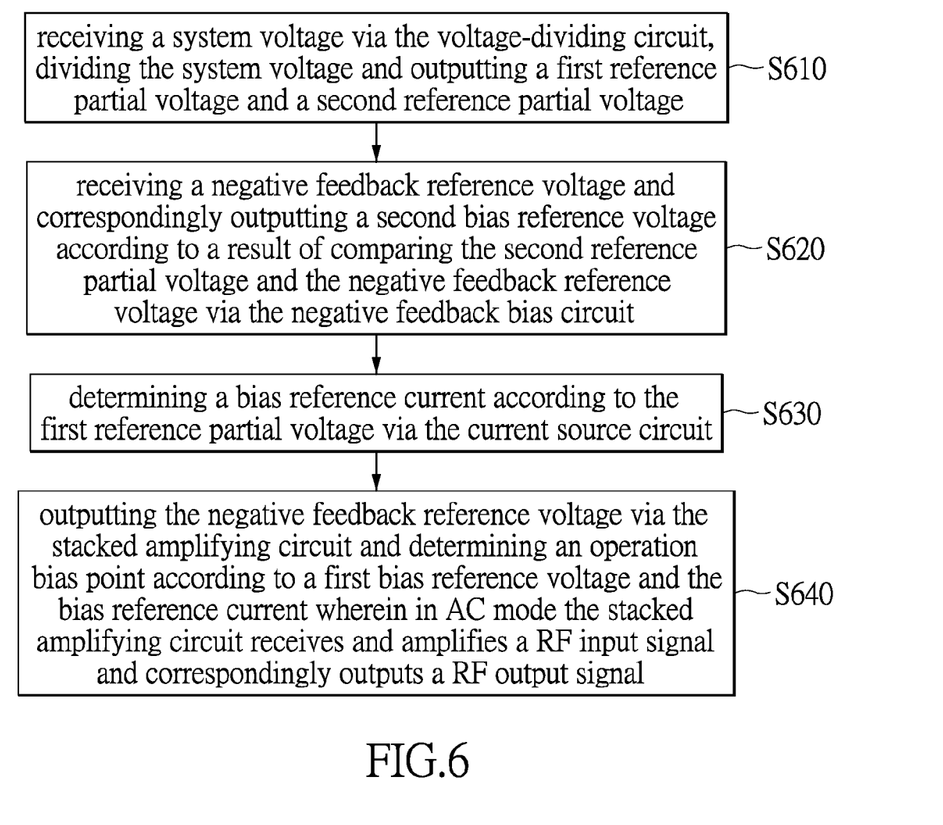
FIG. 6 is a flow chart of the bias method according to another embodiment of the instant disclosure.

Please refer to FIG. 6, FIG. 6 is a flow chart of the bias method according to another embodiment of the instant disclosure. The method of the present embodiment may be conducted in the electric system of the RF stacked power amplifiers shown in FIGS. 1~3, and thus please refer to FIGS. 1~3 for further understanding. The bias method comprises steps as follows: receiving a system voltage via the voltage-dividing circuit, dividing the system voltage and outputting a first reference partial voltage and a second reference partial voltage (Step S610); receiving a negative feedback reference voltage and correspondingly outputting a second bias reference voltage according to a result of comparing the second reference partial voltage and the negative feedback reference voltage via the negative feedback bias circuit (Step S620); determining a bias reference current according to the first reference partial voltage via the current source circuit (Step S630); and outputting the negative feedback reference voltage via the stacked amplifying circuit and determining an operation bias point according to a first bias reference voltage and the bias reference current wherein in AC mode the stacked amplifying circuit receives and amplify a RF input signal and correspondingly outputs a RF output signal (Step S640).

Relevant details of the steps of the bias method regarding the RF stacked power amplifier are described in the embodiments of FIGS. 1-3, and thus it is not repeated thereto. It is clarified that, a sequence of steps in FIG. 4 is set for a need to instruct easily, and thus the sequence of the steps is not used as a condition in demonstrating the embodiments of the instant disclosure.

To sum up, the RF stacked power amplifier and the bias method provided by the instant disclosure makes the voltage-drop and the power consumption of each transistor equal via the voltage-dividing circuit, provides a bias current which could be controlled via the current source circuit, and also provides stable currents with the temperature compensation and the compensation of the system voltage.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A RF stacked power amplifier, comprising:
    a voltage-dividing circuit, receiving a system voltage and dividing the system voltage so as to output a first reference partial voltage and a second reference partial voltage;
    a negative feedback bias circuit, electrically connected to the voltage-dividing circuit so as to receive the second reference partial voltage, the negative feedback bias circuit receiving a negative feedback reference voltage and correspondingly outputting a second bias reference voltage according to a result of comparing the second reference partial voltage and the negative feedback reference voltage;
    a current source circuit, electrically connected to the voltage-dividing circuit so as to receive the first reference partial voltage, the current source circuit determining a bias reference current according to the first reference partial voltage; and
    a stacked amplifying circuit, electrically connected to the current source circuit and the negative feedback bias circuit, the stacked amplifying circuit outputting the negative feedback reference voltage and determining an operation bias point according to a first bias reference voltage and the bias reference current;
    wherein in AC mode the stacked amplifying circuit receives and amplifies a RF input signal and correspondingly outputs a RF output signal.

2. The RF stacked power amplifier according to claim 1, wherein the voltage-dividing circuit comprises:
    a first reference resistor, having one terminal electrically connected to a ground voltage and having another terminal outputting a first reference voltage, the first reference resistor having a first resistance value; and
    a second reference resistor, having one terminal electrically connected to another terminal of the first reference resistor and having another terminal electrically connected to the system voltage, the second reference resistor having a second resistance value;

wherein voltage value of the first reference voltage is determined according to the system voltage, the first resistance value and the second resistance value, and the first reference partial voltage and the second reference partial voltage are the first reference voltage.

3. The RF stacked power amplifier according to claim 2, wherein the negative feedback bias circuit comprises:
   a second comparator, having a positive input terminal electrically connected to one terminal of the second resistor so as to receive the first reference voltage and having a negative input terminal electrically connected to the stacked amplifying circuit so as to receive the negative feedback reference voltage, the second comparator comparing the first reference voltage with the negative feedback reference voltage and correspondingly outputting the second bias reference voltage at its output terminal;
   a second filtering resistor, having one terminal electrically connected to an output terminal of the second comparator and having another terminal electrically connected to the stacked amplifying circuit; and
   a second filtering capacitor, having one terminal electrically connected to another terminal of the second filtering resistor and having another terminal electrically connected to the ground voltage.

4. The RF stacked power amplifier according to claim 3, wherein the current source circuit comprises:
   a steady-current transistor, having source electrically connected to the ground voltage;
   a voltage comparator, having a positive input terminal electrically connected to the steady-current transistor so as to receive drain voltage of the steady-current transistor, having a negative input terminal electrically connected to another terminal of the first reference resistor so as to receive the first reference voltage, and having an output terminal electrically connected to gate of the steady-current transistor, the voltage comparator configured to compare drain voltage of the steady-current transistor and the first reference voltage; and
   a reference current source, having one terminal electrically connected to the system voltage and having another terminal electrically connected to drain of the steady-current transistor, the reference current source having a predetermined reference current;
   wherein the voltage comparator adjusts gate voltage of the steady-current transistor according to a result of comparing the drain voltage of the steady-current transistor and the first reference voltage so as to stabilize the predetermined reference current.

5. The RF stacked power amplifier according to claim 4, wherein the stacked amplifying circuit comprises:
   a first inductor, having one terminal electrically connected to output terminal of the voltage comparator;
   a first transistor, having gate electrically connected to another terminal of the first inductor so as to receive the first bias reference voltage and having source electrically connected to the ground voltage, wherein the first transistor and the steady-current transistor form a configuration of a current mirror circuit and width-to-length ratio of the first transistor to the steady-current transistor determines ratio of the bias reference current to the predetermined reference current;
   a second transistor, having gate electrically connected to another terminal of the second filtering resistor so as to receive the second bias reference voltage and having source electrically connected to drain of the first transistor and outputting the negative feedback reference voltage, wherein the second transistor and the second comparator form a configuration of a source follower; and
   a second inductor, having one terminal electrically connected to drain of the second transistor and having another terminal electrically connected to the system voltage;
   wherein ratio of the second resistance value to the first resistance value determines ratio of drain-to-source voltage of the first transistor to drain-to-source voltage of the second transistor;
   wherein drain-to-source voltage of the first transistor equals to drain-to-source voltage of the steady-current transistor so as to reduce early effect.

6. The RF stacked power amplifier according to claim 5, wherein the stacked amplifying circuit further comprises:
   an input capacitor, having one terminal receiving the RF input signal and having another terminal electrically connected to gate of the first transistor; and
   an output capacitor, having one terminal electrically connected to drain of the second transistor and having another terminal outputting the RF output signal.

7. A bias method, used in a RF stacked power amplifier, the RF stacked power amplifier comprising a voltage-dividing circuit, a negative feedback bias circuit, a current source circuit and a stacked amplifying circuit, the negative feedback bias circuit electrically connected to the voltage-dividing circuit, the current source circuit electrically connected to the voltage-dividing circuit, and the stacked amplifying circuit electrically connected to the current source circuit and the negative feedback bias circuit, the bias method comprising:
   receiving a system voltage via the voltage-dividing circuit, dividing the system voltage and outputting a first reference partial voltage and a second reference partial voltage;
   receiving a negative feedback reference voltage and correspondingly outputting a second bias reference voltage according to a result of comparing the second reference partial voltage and the negative feedback reference voltage via the negative feedback bias circuit;
   determining a bias reference current according to the first reference partial voltage via the current source circuit; and
   outputting the negative feedback reference voltage via the stacked amplifying circuit and determining an operation bias point according to a first bias reference voltage and the bias reference current wherein in AC mode the stacked amplifying circuit receives and amplifies a RF input signal and correspondingly outputs a RF output signal.

8. The bias method according to claim 7, wherein the voltage-dividing circuit comprises:
   a first reference resistor, having one terminal electrically connected to a ground voltage and having another terminal outputting a first reference voltage, the first reference resistor having a first resistance value; and
   a second reference resistor, having one terminal electrically connected to another terminal of the first reference resistor and having another terminal electrically connected to the system voltage, the second reference resistor having a second resistance value;
   wherein voltage value of the first reference voltage is determined according to the system voltage, the first resistance value and the second resistance value, and the first reference partial voltage and the second reference partial voltage are the first reference voltage.

9. The bias method according to claim 8, wherein the negative feedback bias circuit comprises:

a second comparator, having a positive input terminal electrically connected to one terminal of the second resistor so as to receive the first reference voltage and having a negative input terminal electrically connected to the stacked amplifying circuit so as to receive the negative feedback reference voltage, the second comparator comparing the first reference voltage and the negative feedback reference voltage and correspondingly outputting the second bias reference voltage at its output terminal;

a second filtering resistor, having one terminal electrically connected to an output terminal of the second comparator and having another terminal electrically connected to the stacked amplifying circuit; and a second filtering capacitor, having one terminal electrically connected to another terminal of the second filtering resistor and having another terminal electrically connected to the ground voltage.

10. The bias method according to claim 9, wherein the current source circuit comprises:

a steady-current transistor, having source electrically connected to the ground voltage;

a voltage comparator, having a positive input terminal electrically connected to the steady-current transistor so as to receive drain voltage of the steady-current transistor, having a negative input terminal electrically connected to another terminal of the first reference resistor so as to receive the first reference voltage, and having an output terminal electrically connected to gate of the steady-current transistor, the voltage comparator configured to compare drain voltage of the steady-current transistor and the first reference voltage; and a reference current source, having one terminal electrically connected to the system voltage and having another terminal electrically connected to drain of the steady-current transistor, the reference current source having a predetermined reference current;

wherein the voltage comparator adjusts gate voltage of the steady-current transistor according to a result of comparing the drain voltage of the steady-current transistor and the first reference voltage so as to stabilize the predetermined reference current.

11. The bias method according to claim 10, wherein the stacked amplifying circuit comprises:

a first inductor, having one terminal electrically connected to output terminal of the voltage comparator;

a first transistor, having gate electrically connected to another terminal of the first inductor so as to receive the first bias reference voltage and having source electrically connected to the ground voltage, wherein the first transistor and the steady-current transistor form a configuration of a current mirror circuit and width-to-length ratio of the first transistor to the steady-current transistor determines ratio of the bias reference current to the predetermined reference current;

a second transistor, having gate electrically connected to another terminal of the second filtering resistor so as to receive the second bias reference voltage and having source electrically connected to drain of the first transistor and outputting the negative feedback reference voltage, wherein the second transistor and the second comparator form a configuration of a source follower; and a second inductor, having one terminal electrically connected to drain of the second transistor and having another terminal electrically connected to the system voltage;

wherein ratio of the second resistance value to the first resistance value determines ratio of drain-to-source voltage of the first transistor to drain-to-source voltage of the second transistor;

wherein drain-to-source voltage of the first transistor equals to drain-to-source voltage of the steady-current transistor so as to reduce early effect.

12. The bias method according to claim 11, wherein the stacked amplifying circuit further comprises:

an input capacitor, having one terminal receiving the RF input signal and having another terminal electrically connected to gate of the first transistor; and an output capacitor, having one terminal electrically connected to drain of the second transistor and having another terminal outputting the RF output signal.

* * * * *